US010547171B2

(12) United States Patent
Mirabella et al.

(10) Patent No.: US 10,547,171 B2
(45) Date of Patent: Jan. 28, 2020

(54) CURRENT LIMITER, CORRESPONDING DEVICE AND METHOD

(71) Applicant: STMicroelectronics S.r.l., Agrate Brianza (IT)

(72) Inventors: Ignazio Bruno Mirabella, Scicli (IT); Francesco Pulvirenti, Acireale (IT); Salvatore Pappalardo, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 312 days.

(21) Appl. No.: 15/596,465

(22) Filed: May 16, 2017

(65) Prior Publication Data
US 2018/0159317 A1 Jun. 7, 2018

(30) Foreign Application Priority Data

Dec. 5, 2016 (IT) ........................ 102016000123267

(51) Int. Cl.
*H02H 9/02* (2006.01)
*H02H 7/00* (2006.01)
*H03K 17/082* (2006.01)

(52) U.S. Cl.
CPC ............ *H02H 9/025* (2013.01); *H02H 7/008* (2013.01); *H03K 17/0822* (2013.01)

(58) Field of Classification Search
CPC ..... H02H 9/025; H02H 7/008; H03K 17/0822
See application file for complete search history.

(56) References Cited

U.S. PATENT DOCUMENTS

| 6,166,530 A | 12/2000 | D'Angelo |
| 7,245,113 B2 | 7/2007 | Chen et al. |
| 7,728,655 B2 | 6/2010 | Ng et al. |
| 8,914,105 B2 * | 12/2014 | Wanasek .............. A61N 1/3625 607/9 |

(Continued)

FOREIGN PATENT DOCUMENTS

| GB | 2267003 A | 11/1993 |
| JP | 2006115594 A | 4/2006 |

OTHER PUBLICATIONS

First Office Action and Search Report for co-pending CN Patent Appl. No. 201710386820.2 dated Dec. 19, 2018 (7 pages).

(Continued)

*Primary Examiner* — Scott Bauer
(74) *Attorney, Agent, or Firm* — Crowe & Dunlevy

(57) ABSTRACT

A power transistor supplying power to a load is coupled to a current limiter circuit including a differential amplifier that operates to detect a difference between a sense voltage, indicative of a load current, and a voltage reference. A control terminal of the power transistor is driven by a first output of the differential amplifier as a function of the detected difference. A voltage clamp circuit coupled to an input terminal generates a floating ground. A short-circuit protection circuit coupled to the floating ground and interposed between a second output of the differential amplifier and the control terminal of the power transistor provides a short-circuit protection for the first output of the differential amplifier. A reaction time circuit is coupled between the first and second outputs of the differential amplifier and a source terminal of the power transistor to limit a short-circuit current at the source terminal.

24 Claims, 4 Drawing Sheets

(56) References Cited

U.S. PATENT DOCUMENTS

| | | | | |
|---|---|---|---|---|
| 2007/0156258 | A1* | 7/2007 | Briskin | H02H 9/025 |
| | | | | 700/40 |
| 2008/0253154 | A1* | 10/2008 | Schiene | G05F 1/70 |
| | | | | 363/50 |
| 2011/0304941 | A1 | 12/2011 | Tanimura et al. | |
| 2015/0016005 | A1* | 1/2015 | Simonson | H02H 9/025 |
| | | | | 361/93.9 |
| 2015/0117075 | A1* | 4/2015 | Matsumoto | H02M 1/126 |
| | | | | 363/126 |
| 2017/0063074 | A1* | 3/2017 | Yasusaka | H01L 27/0255 |

OTHER PUBLICATIONS

IT Search Report and Written Opinion for IT Appl. No. 2016000123267 dated Aug. 3, 2017 (10 pages).

\* cited by examiner

CURRENT LIMITER, CORRESPONDING DEVICE AND METHOD

PRIORITY CLAIM

This application claims the priority benefit of Italian Application for Patent No. 102016000123267, filed on Dec. 5, 2016, the disclosure of which is hereby incorporated by reference in its entirety.

TECHNICAL FIELD

The description refers to current limiters.

One or more embodiments may be applied, for example, to devices designed to operate in a space environment or, in general, in application contexts in which the design of the current absorption paths is important, for example in the presence of an overload, or even short-circuits, during operation.

Circuits comprising programmable current limiters, for example in the field of vehicles or systems powered by battery, constitute examples of such possible applications.

BACKGROUND

Devices such as, for example, the devices used for space missions may be subjected to various stresses due to the environment in which they are located.

For example, phenomena due to accumulation of radiation, or TID (Total Ionizing Dose), can increase the current consumption of the electronic circuits, or even of entire systems, exhausting the energy resources present in a satellite in a short time, resources which are difficult to regenerate during the mission. The impact of heavy ions (a single event transient—SET) can generate current peaks in the devices downstream of the power supplies, in such a manner as to damage the devices themselves, to alter the current consumption or to create short-circuits, also with some important consequences.

A current limiter may be considered as an intelligent fuse. The purpose of a fuse can be to protect a power supply and/or a load from detrimental effects due, for example, to a short-circuit or to an excessive current demand by a load.

A fuse may prove to be too slow with a reaction time that is insufficient to guarantee the integrity of the system, with a risk of damaging devices or parts of the system.

A current limiter may thus be seen as an "intelligent" fuse which exhibits a negligible impedance under normal operating conditions and switches into a high impedance state when the current flowing through it exceeds a programmed limiting level.

A fast reaction time of the current limiter reduces the probability of damaging the downstream devices from the first moments of the onset of the fault, for example because it limits the current, thus reducing the stress on the components.

After the fault has been repaired, the current limiter (if programmed appropriately) may be able to spontaneously return to the low-impedance state even without a recovery intervention.

When the current limiting circuit is in operation, various solutions may provide for the voltage across the terminals of a sense resistor Rsense to supply information on the value of the current (Isense) flowing through the load.

The voltage VRsense across the terminals of the resistor Rsense may be compared with a voltage reference, for example fixed, by means of an operational amplifier which drives, for example, a control electrode (for example, the gate) of a power transistor (for example, a power p-channel MOS (PMOS) transistor) biasing it into a triode region or into an active region, respectively, in the case of a typical operation of the system or under current limiting conditions.

In such a solution, the current limiting value $I_{LIM}$ may be imposed by the balancing (of voltage) between the voltage drop across the terminals of Rsense and the voltage reference at the input of the operational amplifier (High Voltage), for example according to a relationship of the type:

$$I_{LIM} = \text{Voltage Reference}/R\text{sense}$$

When the load demands a value of current higher than the programmed limiting value, the voltage across the terminals of the resistor Rsense tends to become larger than the voltage reference, the negative feedback loop acts in such a manner that the output of the operational amplifier increases the gate potential of the Power PMOS in such a manner as to determine the situation of equilibrium in which the system draws the maximum programmed limiting current $I_{LIM}$. In this new condition of equilibrium, the voltages VRsense and reference equalize and the output of the operational amplifier can drive the gate of the Power P_MOS from the linear region to the saturation region.

U.S. Pat. Nos. 7,245,113 and 7,728,655 (incorporated by reference) show examples of the above.

Despite the extensive activity in the sector, there is still a need to provide improved solutions for current limiters.

SUMMARY

One or more embodiments may provide improved solutions under various aspects such as, for example:

- a voltage clamp formed for example by means of a Zener diode with a resistor in series in order to give rise to a floating ground system, and/or
- an operational amplifier (for example High Voltage) in class A with a bootstrap system for the reaction time, and/or
- a short-circuit protection placed between the operational amplifier and the power transistor (for example a power P_MOS).

One or more embodiments may protect both the power supplies and the loads because the intervention times are fast, for example of the order of a few microseconds.

One or more embodiments may offer one or more of the following advantages:

- the circuits of the current limiter, for example integrated (Integrated Current Limiter—ICL) are not referenced to the ground of the system, which is why, if there were to be a short-circuit, they do not load the power supply bus;
- the output of the operational amplifier (High Voltage) may potentially go into short-circuit to ground with the absorbed current limit made dependent on the imposition of the limitation to the short-circuit;
- it is possible to take into account the fact that the output of the amplifier could undergo a short-circuit to the floating ground by dimensioning the voltage of the Zener diode so as not to cause the breakdown of the power transistor (for example POWER P_MOS); for example, it is possible to choose the voltage VZ so as not to expose the circuit components to risks of being damaged by phenomena linked to the space environment (for example SEL and SES);
- the overall architecture may have fast reaction times and may protect both the loads and the power supplies;

the circuits are versatile in voltage and may be biased even above 100 V;
possibility of using less additional architecture;
simplicity of implementation;
reduced occupation of space occupied on silicon;
speed in the reaction times of the entire system.

For example, in one or more embodiments it is possible to take into account factors such as:
during normal operation, a sudden increase in the load current could lead to an inertia in the current response of a voltage generator, with the possible consequence of a drop in the power supply voltage, which is able to trigger an on and off looping of the power transistor (for example, Power PMOS);
at the time when circuit parts were impacted by heavy ions, these could trigger a current latch-up capable of discharging the power supplies of a satellite, which may prejudice the outcome of a mission.

In an embodiment, a current limiter circuit is provided for a power transistor feeding a load. The current limiter circuit includes: an input terminal for receiving a supply voltage; a current output terminal coupleable to a current path through the power transistor; a control output terminal coupleable to a control terminal of the power transistor; a sense resistor set between the input terminal and the current output terminal to provide a sense voltage indicative of the current at said current output terminal; a voltage reference generator to provide a reference voltage; and a differential amplifier coupled with the sense resistor and the voltage reference generator, the differential amplifier including at least one output driving said control output terminal as a function of the difference between the sense voltage and the reference voltage. The circuit includes at least one of: i) a voltage clamp unit coupled with the input terminal, the voltage clamp providing a floating ground for the current limiter circuit; and/or ii) a reaction-time unit set between the differential amplifier and the current output terminal to limit a short circuit current at said current output terminal; and/or iii) a short-circuit protection unit set between the differential amplifier and the control output terminal to provide short-circuit protection of the output of the differential amplifier.

In an embodiment, a method of limiting current through a power transistor feeding a load, comprises: providing a current limiter circuit with an input terminal receiving a supply voltage, a current output terminal coupled to a current path through the power transistor and a control output terminal coupled to a control terminal of the power transistor; providing a sense voltage indicative of the current at said current output terminal and a reference voltage; and detecting via said differential amplifier the difference between the sense voltage and the reference voltage by driving said control output terminal ad a function of the difference between the sense voltage and the reference voltage. The method includes at least one of: i) coupling a voltage clamp with the input terminal, the voltage clamp providing a floating ground for the current limiter circuit; and/or ii) setting a reaction-time unit between the differential amplifier and the current output terminal to limit a short circuit current at said current output terminal; and/or iii) setting a short-circuit protection unit between the differential amplifier and the control output terminal to provide short-circuit protection of the output of the differential amplifier.

BRIEF DESCRIPTION OF THE DRAWINGS

One or more embodiments will now be described, purely by way of non-limiting example, with reference to the appended figures, in which.

DETAILED DESCRIPTION

In the description that follows, one or more specific details are illustrated, with the aim of providing a deeper understanding of the exemplary embodiments in this description. The embodiments may be obtained without one or more of the specific details or with other methods, components, materials, etc. In other cases, known operations, materials or structures are not illustrated or described in detail in order that some aspects of the embodiments will not be rendered unclear.

A reference to "an embodiment" in the framework of the present description is intended to indicate that a particular configuration, structure, feature described with reference to the embodiment is included in at least one embodiment. So, the phrases such as "in one embodiment", which may appear in one or more points of the present description, do not necessarily refer to one and the same embodiment. Furthermore, particular configurations, structures or features may be combined in any appropriate manner in one or more embodiments.

The references used here are provided simply as a convenience and, as such, do not define the scope of protection or the scope of the embodiments.

The claims form an integral part of the technical teaching provided here with regard to the embodiments.

Figure 1:
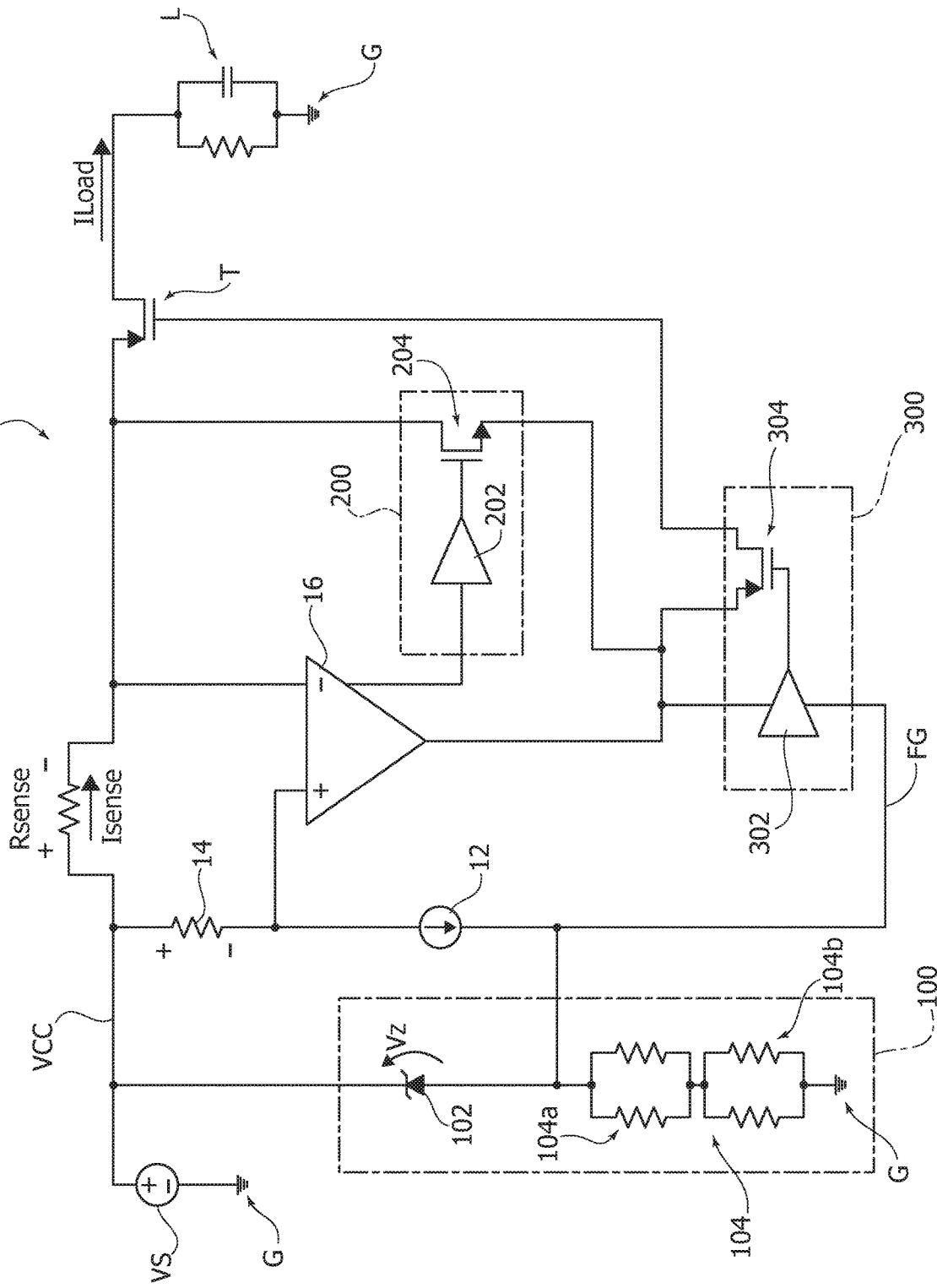
FIG. 1 is a circuit diagram of a current limiter circuit.
Figure 2:
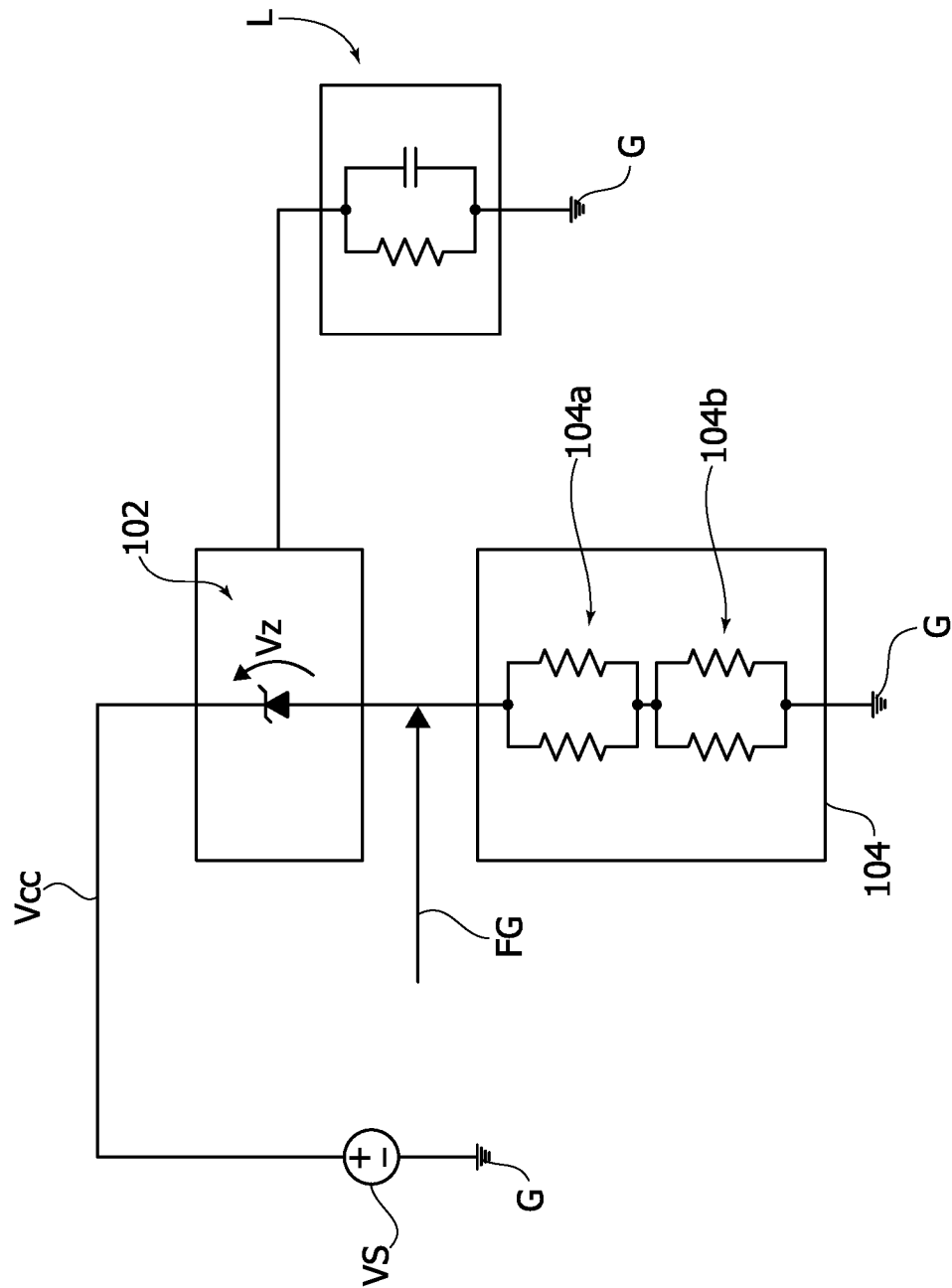
FIG. 2 is a circuit diagram of a circuit part within FIG. 1.

In FIGS. 1 and 2, the reference VS indicates a power supply source (in voltage, for example at a value VCC) designed to supply a load L, here exemplified—where the intent is non-limiting—as an RC network, via a power transistor T (for example, a Power p-channel MOS (PMOS) transistor).

It will, however, be appreciated that the source VS, the transistor T and/or the load L may by themselves constitute elements distinct from the embodiments.

In FIG. 1, one example of a current limiter circuit 10 is shown interposed between the source VS and the transistor T.

As has already been said, a current limiter may be seen as a sort of "intelligent" fuse which exhibits a negligible impedance under normal conditions of operation and goes into a high impedance state when the current flowing through it exceeds a programmed limiting level.

For example, in the circuit 10, a sense resistor Rsense may be present through which a current Isense can flow going from the source VS towards the transistor T, for example with the value of the current Isense (hence of the voltage VRsense across the terminals of the resistor Rsense) which is able to indicate the value of the current Iload flowing in the load L through the current path of the transistor T (source-drain path in the case in which the transistor T is a field-effect transistor such as a PMOS transistor).

In a circuit diagram such as that exemplified in FIG. 1, a reference current generator 12 (of a type known per se) may be present coupled by means of a voltage reference resistor 14 to a point or circuit node intermediate between the source VS and the first terminal of the resistor Rsense.

The reference current generator 12 is coupled (on the side facing the resistor 14) to an input (for example, non-inverting) of a differential amplifier (for example, an operational amplifier, such as a High Voltage Op-Amp) 16 whose other input is coupled to a point or circuit node intermediate between the second terminal of the resistor Rsense and the source of the transistor T that supplies the load L.

The output of the operational amplifier 16 could, by itself, be used to directly drive the transistor T, for example with the output of the operational amplifier 16 connected directly to the gate (control terminal) of the transistor T.

Adopting such a configuration, upon powering up the circuit, a precise current reference (namely the generator 12) can set the voltage reference at the non-inverting input of the operational amplifier 16, whereas the inverting terminal of the operational amplifier 16 is at a potential close to that of the source VS (reduced by the voltage drop across the terminals of Rsense).

Under these conditions, the initial biasing of the differential inputs of the operational amplifier 16 can make the source-gate potential difference (Vsg) of the transistor T rise, turning it on and making a current ILoad flow through the load L and the resistor Rsense.

If the current in the load ILoad is less than the limiting current value $I_{LIM}$, the system remains unaffected.

If, on the contrary, the current in the load ILoad increases and the voltage across the terminals of the resistor Rsense is close to the voltage reference across the terminals of the resistor 14, the operational amplifier 16 tends to the condition of equilibrium and, if connected directly to the gate of the transistor T, tends to decrease the gate-source voltage of the transistor T taking the transistor into the saturation region, through which the feedback system finds a point of equilibrium between the voltage Vsg of the transistor T, the current absorbed by the load and the voltages present at the differential inputs of the operational amplifier 16.

However, in the case of a short-circuit of the load L leading to an sudden consumption of current, so as to make the voltage across the terminals of the resistor Rsense rise much higher than the voltage reference, a conventional system where the output of the operational amplifier 16 is used to directly drive the transistor T would need a certain amount of time in order to stabilize itself to the limiting current value.

Such a solution (i.e., where output of the operational amplifier 16 is directly used to drive the transistor T) may present several drawbacks.

For example, the circuits of the limiter (ICL), if referenced to the same ground of the power supply, may exhibits various aspects of malfunction such as:

short-circuits in the presence of fast transient events,
current latch-up phenomena instigated by the impact of heavy ions during, for example, missions in orbit.

Both these phenomena could lead to the discharge of the power supplies or could cause their collapse towards ground G.

Again, during normal operation, a sudden increase in the load current could lead to an inertia in the current response of the voltage generator, with the consequence of a possible drop in the power supply voltage which is able to instigate an on and off looping of the transistor T.

Lastly, a circuit of this type would not prove to be very versatile in voltage: when the power supply voltages are increased the circuits are exposed to risks of breakdown, for example through phenomena associated with the space environment (single event latch-up—SEL—and single event snapback—SES).

More generally, an architecture as hypothesized hereinabove (i.e., with the output of the differential amplifier 16 directly driving the transistor T) could have reaction times that are slow with respect to the requirement for protection of sensitive loads. For example, in the absence of protections on the output of the operational amplifier 16, this node could lead to a higher voltage value than the AMR (Absolute Maximum Range) of the voltage Vgs of the transistor T, causing its breakdown. In extreme cases (for example, a short-circuit between gate and drain of the transistor T) the output of the operational amplifier 16 could go to ground potential G of the system causing an undesirable absorption of current.

One or more embodiments can offer various measures for taking into account the drawbacks set out hereinabove.

As exemplified in the present description, these measures may be implemented in combination with one another, notwithstanding the fact that, in one or more embodiments, these measures may also be implemented individually or in sub-combinations with respect to those provided here.

In one or more embodiments, as exemplified here, these measures may comprise:

a voltage clamp 100, arranged between the input terminals of the current limiter 10 to which the voltage VS and ground G is applied, where the clamp may be formed, for example, by means of at least one Zener diode 102 with a resistor 104 (which may comprise a network of resistors) in series so as to give rise to a floating ground FG node coupled to an output of the current source 12, and/or a bootstrap circuit 200 for the reaction time of the operational amplifier 16 (able to operate in class A), where this circuit may comprise a drive stage 202 which is coupled to the differential amplifier 16 and which drives a switch 204 (for example, an electronic switch such as a MOSFET) arranged between the output of the operational amplifier 16 and the output terminal of the current limiter 10 on which the current ILoad is present, and/or a short-circuit protection 300 placed between the operational amplifier 16 and the power transistor T (for example, a power PMOS), this protection comprising a drive stage 302 which is coupled to the operational amplifier 16 and to the floating ground FG and which drives a switch 304 (for example, an electronic switch such as a MOSFET) arranged between the output of the operational amplifier 16 and the control terminal (for example, gate) of the power transistor T.

In one or more embodiments, the coupling of the Zener diode 102 (which can be disposed with the cathode towards the input terminal of the current limiter 10 to which the voltage VS is applied, for example equal to VCC) and the resistor 104 (which can be connected between the anode of the diode 102 and ground G) provides a fixed voltage reference (VCC–$V_Z$)—where $V_Z$ is the voltage drop on the Zener diode 102—and can give rise (in a position interposed between the diode 102 and the resistor 104) to a reference floating ground FG for the circuits of the current limiter.

In one or more embodiments, the implementation of such a floating ground FG allows the collapse—due to a possible short-circuit of the blocks of the current limiter 10—of the power supply line with respect to ground G to be avoided.

In one or more embodiments, the resistor 104 (which can be interposed between the diode 102 and ground G) may comprise a resistive network with a plurality of resistive cells (for example, two resistive cells 104a, 104b) in series with one another, where each cell may in turn comprise plural (for example, two) resistors connected in parallel with one another. In this way, in one or more embodiments, it is possible to ensure that, if a resistor of the network 104a, 104b goes into short-circuit, or burns out becoming an open circuit, the protection is still provided by the other resistors.

In one or more embodiments, these resistors may be dimensioned by taking into account the maximum current absorbed by the whole assembly of the circuits of the current limiter 10, including the activation current of the Zener diode 102.

In one or more embodiments, the current consumption of the limiter 10 is mainly attributable to the quiescent current absorbed by the "core" of the current limiter—in other words by the operational amplifier 16—and to the current Iz flowing through the diode 102.

The series/parallel resistors 104a, 104b may be considered as a single resistor (the resistor 104) which can be dimensioned so as to be capable of dissipating the power depending on the value VCC from the power supply bus, for example:

$$R_F = (VCC - V_Z)/(ICC + I_Z) \approx (VCC - V_Z)/2ICC$$

where:
VCC=power supply voltage of the system (source VS);
$V_Z$=VCC−VFG, where VFG is the voltage of the floating ground FG;
ICC=quiescent current absorbed by the circuitry of the limiter;
$I_Z$=activation current of the Zener diode, dimensioned so as to be similar to ICC.

In one or more embodiments, the floating ground FG is separated from the ground G of the system, for example by the series/parallel resistors 104a, 104b, in such a manner as to be able to protect the power supply in the case in which the limiter 10 experiences an internal short-circuit, with the risk of inducing permanent or irreversible damage to the power supply system (for example, which may affect the outcome of a space mission).

The configuration with floating ground FG can offer versatility to the current limiter system, for example allowing the system to work with loads operating with voltages in the range between a few volts above $V_Z$ to over 100V, also being able to offer the internal circuits of the current limiter a biasing voltage that is almost constant.

In one or more embodiments, the zener voltage $V_Z$ of the diode 102 may be chosen to be in the range between the maximum voltage capability between the VGS of the power transistor T (for example, Power PMOS) and the maximum voltage capability of the circuitry with respect to the SES and SEL phenomena, also taking into account the fact that the higher is $V_Z$, the lower is the speed of reaction (reaction time) to the short-circuit.

In one or more embodiments, the resistors 104a, 104b, in other words the resistor 104, may be dimensioned in such a manner that the Zener diode 102 is always active with an internal flow of current of the same scale as ICC.

In one or more embodiments, this solution allows for avoiding fluctuations of the power supply (due for example to sudden increases in current drawn by the load and/or to potential SETs that initiate extra current consumption by the circuits of the current limiter) that have repercussions on the circuits driving the power transistor T (driving it, for example, into a triode region) that can initiate potential instability loops. In this way, variations in voltage on the input terminal (voltage VCC) may have an impact essentially as a variation in the current of the Zener diode 102 modulating the voltage of the floating ground FG, without appreciably influencing the currents (for example, ICC) in the circuits of the current limiter itself. The current consumption of the circuit may thus be essentially uncorrelated with respect to the condition of the ON/OFF state of the limiter and remains substantially the same irrespective of the operational condition (ON or OFF).

Figure 3:
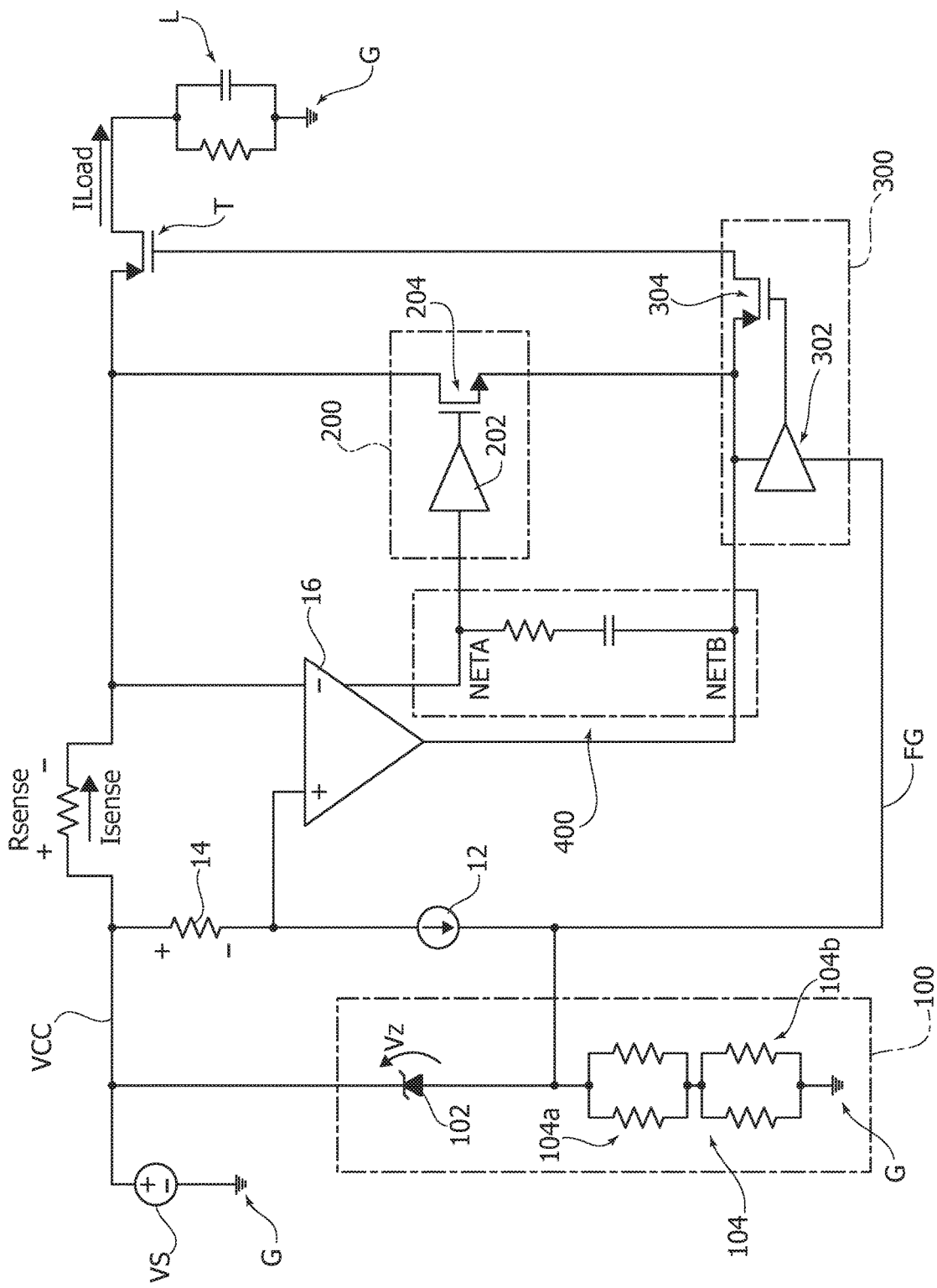
FIG. 3 is a circuit diagram of a current limiter circuit.

The circuit diagram in FIG. 3 exemplifies the possibility, already provided in the circuit diagram in FIG. 1, that in one or more embodiments, the reaction time circuit or unit 200 (capable of accelerating the extinction of the power transistor T and thus of rapidly limiting the short-circuit current of the load L) and the short-circuit protection circuit or unit 300 (protection against short-circuits to ground of the output of the operational amplifier 16) are coupled to the operational amplifier 16, instead of via a single output, via two outputs respectively indicated with NETA and NETB (see also, the circuit diagram in FIG. 4): as a result of the above provision, a filtering network, for example an RC network 400, may be interposed between these outputs NETA and NETB.

In one or more embodiments, upon turning on the power supply, the block 100 (Zener diode 102 and resistor 104) imposes the operating voltage of the circuits of the current limiter 10 at the zener voltage $V_Z$.

The power transistor T turns on (in other words becomes conducting) and there is the flow of current Iload towards the load generating a voltage VRsense across the terminals of Rsense.

Figure 4:
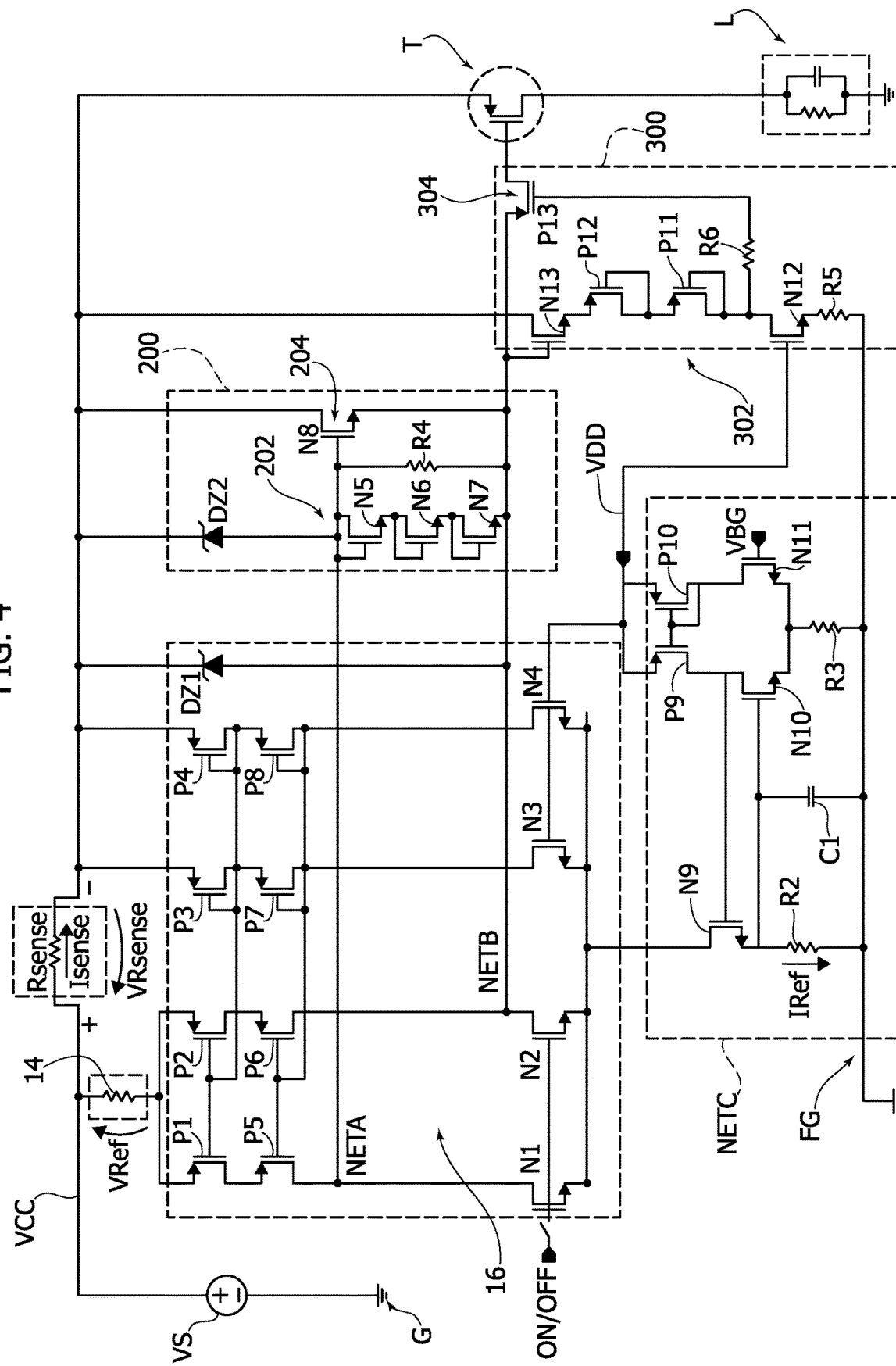
FIG. 4 is a circuit diagram of a current limiter circuit.

If the absorbed current is reduced or varies slowly to a value close to the expected limiting value, the circuit exemplified in FIGS. 1 and 4 behaves in a manner similar to a conventional current limiter.

In the case in which there is a short-circuit of the load L, with a sudden increase in current, such that the voltage VRsense across the terminals of Rsense is greater than the voltage reference corresponding to the current limiting value provided, the block or unit 200 is activated (the switch 204 becomes conducting, driven by the stage 202 which "senses" the voltage at the output of the operational amplifier 16—in turn a function of the difference between VRsense and the voltage reference provided by the generator 12 and by the resistor 14) limiting the current Iload within a short period of time (around a microsecond) to the limiting value provided.

In one or more embodiments, the circuits of the limiter may be furthermore protected from potential short-circuits in the transistor T (for example, between gate and drain in the case of a Power PMOS) which could instigate undesirable current consumptions in such a manner as to compromise the operation of the system.

The circuit diagram in FIG. 4 exemplifies details of possible circuit implementations of the circuit diagrams described previously. For the sake of simplicity, in the circuit diagram in FIG. 4, the details of the clamp unit 100 and the network 400 interposed between the outputs NETA and NETB are not visible.

In the circuit diagram exemplified in FIG. 4, the quiescent current of the operational amplifier 16 is generated by a further operational amplifier, indicated as a whole with NETC and which may be seen as substantially corresponding to the generator 12 in FIGS. 1 and 3.

In one or more embodiments, the operational amplifier may be of the voltage/current type of a type known per se and comprising transistors (for example MOSFET) $N_9$, $N_{10}$, $N_{11}$, $P_9$, $P_{10}$ (N=NMOS; P=PMOS), a compensation capacitor $C_1$ and two resistors $R_2$, $R_3$, the circuit being referenced to the floating ground FG produced by virtue of the voltage clamp 100.

The transistors $P_9$, $P_{10}$ form a current mirror which produces a current of intensity $IR_3$ defined by the relationship:

$$IR_3 = (VBG - VGS_{11})/R_3$$

where VBG is a voltage applied to the gate of N11, the gate-source voltage is given by $VGS_{11}$ and $R_3$ is the resistance value of the corresponding resistor.

The voltage VBG is buffered on the resistor $R_2$ by the NMOS $N_9$.

For example, the current Iref may be imposed under a typical condition, for example at 1 mA, by the following relationship:

$$IRef=VBG/R_2\sim 1\text{ mA}$$

Through the mirrors $P_1$, $P_2$, $P_3$, $P_4$, $P_5$, $P_6$, $P_7$, $P_8$ of the operational amplifier 16, the current IRef can enable the voltage VRef across the terminals of the resistor 14 (see also the circuit diagrams in FIGS. 1, 3 and 4) to be fixed (for example, at 100 mV).

$$VRef=Iref*R_1=VBG/R_2*R_1$$

This way of proceeding facilitates the obtaining of a VRef that is precise in temperature and with respect to the possible process variations. This result may be further facilitated by choosing electronic components matched with one another (in the sense of the matching of their values/characteristics) avoiding variations in voltage reference of reduced scale being able to give rise to appreciable variations in the sensitivity of the load current.

The main core of the circuit diagram exemplified in FIG. 4 is the operational amplifier (High Voltage) 16 designed to compare the voltage drop VRsense across the terminals of the resistor Rsense with the voltage drop Vref across the terminals of the resistor 14.

In the example in FIG. 4, the inputs of the operational amplifier 16 are the source of the transistors (for example, MOS) $P_1$, $P_2$ (non-inverting input) and $P_3$, $P_4$ (inverting input). The two outputs are represented by NETA and NETB, as already indicated.

The transistors (for example, MOS) $N_1$, $N_2$, $N_3$, $N_4$, $P_5$, $P_6$, $P_7$, $P_8$ decouple the low-voltage part of the circuit from the current reference with the inputs of the operational amplifier placed at high voltage.

In one or more embodiments, the circuit 10 is activatable/de-activatable by means of an ON/OFF signal (for example ON="high"; OFF="low") applied to the gate of $N_1$, $N_2$.

For example, if the ON/OFF signal on the gates of $N_1$, $N_2$ is low, in the two branches placed on the left side of the operational amplifier 16 (in other words $P_1$, $P_2$, $P_5$, $P_6$) no current is flowing; all the current imposed by the reference flows in the two right branches (in other words $P_3$, $P_4$, $P_7$, $P_8$) of the current mirrors. Therefore, the outputs NETA and NETB will be close to VCC (value of the voltage VS on the input terminal), with the voltage VG on the gate of the transistor T at VCC, hence with the transistor T turned OFF, in other words non-conducting.

If the device is turned on (for example ON=high potential on the gates of $N_1$, $N_2$), there can be three modes of operation of the circuit:
 the load L demands a current lower than the limiting current (normal mode);
 the load current increases slowly and is close to the limiting current (limiting mode);
 in the case of a short-circuit of the load or sudden overload, the feedback of the circuit limits the current Iload in very short times (for example, 1 microsecond), avoiding damage to the devices downstream (limiting mode with reaction time).

For example, in normal mode, if the digital ON/OFF signal goes high, the two branches of the left side of the operational amplifier 16 are activated and the current Iref is divided into the four branches of the amplifier 16 itself.

The outputs NETA and NETB of the operational amplifier 16 are driven to a given potential of (VCC−VDZ1) with VDZ1 representing the zener voltage of a Zener diode DZ1 interposed between the output line which goes to the current path (source-drain, in the case of a FET) of the transistor T and the output NETB, activating the gate of the transistor T and powering the load L in the normal mode of operation.

The current Iload absorbed by the load is practically the same current that is flowing through the sense resistor Rsense, in other words Isense=Iload In one or more embodiments, the voltage VCC−VDZ1 may be dimensioned in such a manner as to facilitate a correct saturation of the channel of the transistor T.

Now considering the limiting mode, if, during the operation, the load L demands current so as to be comparable with the imposed limitation, the operational amplifier 16 tends to the condition of equilibrium, with the voltage VRef equal to the voltage drop across the terminals of Rsense, with the outputs of the operational amplifier 16 increasing the gate voltage of the transistor T biasing it into the saturation region (operation in class A).

In this mode, the load L will not be able to demand more than the limiting current, with the drain voltage of the transistor T that will tend to decrease, until it reaches the condition of equilibrium in which the voltage reference Vref on the resistor 14 tends to be equal to the voltage VRsense on the resistor Rsense.

Considering lastly the limiting mode with reaction time, in the case in which there is a short-circuit of the load L or a sudden overload, it is possible to achieve a fast reaction time by virtue of the different capacitive loads of the output nodes NETA and NETB of the operational amplifier 16, with the node NETB likely to be "heavily" loaded by the (stray) capacitance present between the gate and source of the transistor T, compared with the node NETA.

When the voltage drop VRsense on the resistor Rsense exceeds the voltage reference VRef, the nodes NETA and NETB become unbalanced and the output NETA can jump to VCC faster than the output NETB, because of the greater capacitive load present at NETB.

In a circuit diagram such as that exemplified in FIG. 4, the unbalancing in voltage of the outputs NETA and NETB can raise the gate-source potential of the transistor (for example, NMOS) $N_8$ (in practice corresponding to the switch 204 in FIGS. 1, 3 and 4) which, in one or more embodiments, may be in a bootstrap configuration with the gate coupled between a further Zener diode DZ2 (with one terminal connected to the output line which goes to the current path of the transistor T) and a cascade of transistors (for example MOSFET) $N_5$, $N_6$, $N_7$ connected to a diode (gate in short-circuit to the drain) with a resistor $R_4$ in parallel and referenced to the output NETB of the amplifier 16 with the capacity to supply a high current peak on the node NETB. This current peak can abruptly load (and thus rapidly rise) the gate of the transistor T biasing it into the saturation region, thus driving the circuit into current limiting mode.

A reduced reaction time (for example, a few microseconds) corresponds to a large bandwidth, which could be the source of instability. In one or more embodiments, a compromise may thus be reached with short reaction times (for example, a few microseconds) without affecting the stability criteria of.

In a circuit diagram such as that exemplified in the FIG. 4:
- the function of the Zener diodes DZ1 and DZ2 is to limit the excursion in voltage of the outputs NETA and NETB, respectively, the potential of the latter being capable of possibly damaging the transistor T if the voltage falls below the breakdown level of the gate-source voltage;
- the function of the transistors $N_5$, $N_6$, $N_7$ is to protect the transistor $N_8$ limiting the voltage between gate and source, for example to below 3.3V;
- the resistor $R_4$ has the task of rebalancing the potentials of the outputs NETA and NETB once they have been unbalanced by the reaction to the short.

The part in the lower right of FIG. 4 exemplifies a possible implementation of the unit 300 capable of protecting the operational amplifier 16 in the case in which the control terminal (for example, the gate in the case of a FET) of the transistor T goes into short-circuit to ground G accidentally or through a cause linked to the "breakdown" of the transistor T (a breakdown which could also occur by phenomena linked to individual events or stresses on the transistor T itself).

In the circuit diagram exemplified in FIG. 4, the output NETB of the operational amplifier 16 is decoupled from the control terminal (for example, gate) of the transistor T by means of a transistor $P_{13}$ functioning as a pass gate (in other words as a switch 304 with reference to the circuit diagrams in FIGS. 1, 3 and 4).

During normal operation of the circuit, a transistor (for example, MOSFET) $N_{12}$ and a resistor $R_5$ impose, using a voltage VDD on the generator NETC, a reference current $IR_5$ through the resistor $R_5$ of a voltage clamp comprising three transistors (for example, MOSFET) $N_{13}$, $P_{12}$, $P_{11}$, according to a relationship of the type $$IR_5 = (VDD - VGS\_N_{12})/R_5$$

where $VGS\_N_{12}$ indicates the gate-source voltage of $N_{12}$.

For example, the transistors $N_{13}$, $P_{12}$ and $P_{13}$ can "clamp" the pass gate $P_{13}$ to the output node of the operational amplifier 16 at less than around 2.2V., for example $$VGS\_P_{13} = VGS\_N_{13} + VGS\_P_{12} + VGS\_P_{11} = 2.2V$$

where $VGS\_P_{13}$, $VGS\_N_{13}$, $VGS\_P_{12}$ and $VGS\_P_{11}$ indicate the gate-source voltages of $P_{13}$, $N_{13}$, $P_{12}$ and $P_{11}$.

The voltage reference across the terminals of $VGS\_P_{13}$ ensures that, in the case of short-circuit of the gate with the drain of the transistor T, the pass gate $P_{13}$ saturates and the maximum current allowable is, for example, around 100 mA (where, without protection, short-circuit currents of the order of tens of A could be obtained).

Various experiments on the circuit have been carried out using:
- a power supply voltage VS at a VCC value of 15V;
- a current reference IRef at 1 mA and a corresponding voltage reference VRef at 100 mV on a resistor 14 of 200 Ohms;
- a sense resistor Rsense of 20 milliOhms;
- a limiting current $I_{LIM}$=5 A;
- a load L with an ohmic value equal to 6 Ohm
- a load current Iload equal to 2.5 A.

With a short-circuit condition of the load applied, after 1 millisecond, a circuit without reaction time unit and a circuit with reaction time unit 200 have been compared.

The behaviors of the currents have been measured prior to the short-circuit of the load, with an absorption of 2.5 A and after with an absorption of around 5 A, the value of the limitation imposed, assuming that the short-circuit of the load L implemented takes the voltage of the load from 15V to ground after 1 millisecond, so as to be able to compare the reactions of the two circuits.

It has been observed that, at the time when the short-circuit occurs, the currents may reach peaks of 150 A, also showing that, under the same conditions, a circuit with reaction time unit 200 has an intervention time of around 20 times shorter as compared with an equal architecture without such a unit.

In the presence of slow variations of the load current Iload, a circuit with reaction time unit 200 has demonstrated intervention times of 100 microseconds as compared with 3 milliseconds for a circuit without reaction time unit. Furthermore, the maximum current peaks in the first case does not exceed 5.1 A compared with 6.5 A for the system without reaction time unit, with the transistor T going from the linear region to that of saturation upon the increase in the load current.

It is also observed that, depending on the output load, the circuit, going into current limitation, may potentially be subjected to oscillations capable of having an impact on the main power supplies.

In one or more embodiments, the filter (low-pass) 400 inserted between the outputs NETA and NETB, can avoid these oscillations being able to reach a reasonable compromise with the reaction delay, in as much as the action of the filter can reduce the oscillations without appreciably increasing the reaction time to the short-circuit.

Other experiments have been carried out with success with the following values:
- sense resistor Rsense with value=50 milliOhms;
- maximum limiting current $I_{LIM}$=2 A;
- VCC=37V;
- load L with ohmic value equal to 37 Ohms;
- initial load current Iload 1 A.

It will be understood that, whereas one or more embodiments as exemplified here include the use of field-effect transistors (for example, MOSFET of the P type or of the N type, identifiable as being of one type or of the other by the letters of the respective reference), hence with the gate as control terminal and source and drain (as current source and sink terminals of the current path through the transistor), one or more embodiments may provide, at least in part, the employment of bipolar transistors (hence with the base as control terminal and emitter and collector as current source and sink terminals of the current path through the transistor).

One or more embodiments may therefore relate to a current limiter circuit (for example, 10) for a power transistor (for example, T) supplying power to a load (for example, L), the current limiter circuit comprising:
- an input terminal for receiving a power supply voltage (for example, source VS with voltage VCC),
- a current output terminal coupleable to a current path (for example, source-drain in the case of a FET) through the power transistor,
- a control output terminal coupleable to a control terminal (for example, gate in the case of a FET) of the power transistor (T),
- a sense resistor (for example, Rsense) interposed between the input terminal and the current output terminal in order to supply a sense voltage (for example, VRsense) indicative of the current (for example, Iload) at said current output terminal,
- a voltage reference generator (for example, current generator 12 and resistor 14) to provide a voltage reference (for example, Vref), a differential amplifier (for example, 16) coupled with the sense resistor and the voltage reference generator, the differential amplifier comprising at least one output (for example, NETA, NETB) for driving said control output terminal as a function of the difference between the sense voltage and the voltage reference, in which the circuit comprises at least one from amongst:
i) a voltage clamp unit (for example, 100) coupled with the input terminal (for example, VS, VCC), the voltage clamp providing a floating ground (for example, FG) for the current limiter circuit; and/or
ii) a reaction time unit (for example, 200) interposed between the differential amplifier and the current output terminal in order to limit a short-circuit current at said current output terminal; and/or
iii) a short-circuit protection unit (for example, 300) interposed between the differential amplifier and the control output terminal in order to provide a short-circuit protection for the output of the differential amplifier.

In one or more embodiments, the differential amplifier may comprise an operational amplifier of the high-voltage type.

In one or more embodiments said voltage clamp unit may comprise:
at least one Zener diode (for example, 102) coupled with the input terminal,
at least one resistor (for example, 104; 104a, 104b) between said at least one Zener diode and ground (for example, G),
the connection between the at least one Zener diode and the at least one resistor being able to form said floating ground.

In one or more embodiments, the voltage clamp unit may comprise a resistive network between said at least one Zener diode and ground, said resistive network comprising optionally a plurality of resistive cells disposed in series between said at least one Zener diode and ground, in which at least one of said resistive cells (for example 104a, 104b) may comprise a connection in parallel with a plurality of (for example two) resistors.

In one or more embodiments, said reaction time unit (200) may comprise:
a reaction time drive stage (for example, 202) coupled with an output (for example NETA) of the differential amplifier,
a reaction time switch (for example, 204) interposed between the differential amplifier and the current output terminal, the reaction time switch being activatable (for example in conduction) by the reaction time drive stage as a function of the output of the differential amplifier to which the reaction time drive stage is coupled.

In one or more embodiments, the short-circuit protection unit (300) may comprise:
a short-circuit drive stage (for example, 302) coupled to an output (for example, NETB) of the differential amplifier,
a short-circuit switch (for example, 304) interposed between the differential amplifier and the control output terminal, the short-circuit switch being activatable (for example, in conduction) by the short-circuit drive stage as a function of the output of the differential amplifier to which the short-circuit drive stage is coupled.

In one or more embodiments, the differential amplifier may comprise a first output (for example, NETA) and a second output (for example, NETB, with high capacitive load), with said reaction time drive stage and said short-circuit drive stage coupled to said first output and said second output, respectively.

In one or more embodiments, the current limiter circuit may comprise a network filtering (for example, 400), optionally a low-pass network (for example, RC), interposed between said first output and said second output (for example, between NETA and NETB) of the differential amplifier.

In one or more embodiments, a power supply device may comprise:
a power transistor having a control terminal for controlling the current flow in a current path (for example, source-drain in the case of a FET) through the transistor for supplying power to a load current to an electrical load,
a current limiter circuit (10) according to one or more embodiments, the current limiter circuit having said current output terminal coupled to the current path through the power transistor and said control output terminal coupled to the control terminal of the power transistor.

In one or more embodiments, a method for limiting the current through a power transistor supplying power to a load (L) may comprise:
providing a current limiter circuit with an input terminal receiving a power supply voltage, a current output terminal coupled to a current path through the power transistor and a control output terminal coupled to a control terminal of the power transistor,
providing a sense voltage indicative of the current at said current output terminal and a voltage reference,
measuring by means of a differential amplifier the difference between the sense voltage and the voltage reference, driving said control output terminal as a function of the difference between the sense voltage and the voltage reference,
where the method may comprise at least one from amongst:
i) coupling a voltage clamp to the input terminal, the voltage clamp providing a floating ground for the current limiter circuit; and/or
ii) a reaction time unit between the differential amplifier and the current output terminal in order to limit a short-circuit current at said current output terminal; and/or
iii) interposing a short-circuit protection unit between the differential amplifier and the control output terminal in order to provide a short-circuit protection for the output of the differential amplifier.

Without prejudice to the basic principles, the details and the embodiments may vary, even appreciably, with respect to what has been described here, purely by way of example, without straying from the scope of protection.

The scope of protection is defined by the appended claims.

The invention claimed is:

1. A current limiter circuit for a power transistor feeding a load, comprising:
an input node configured to receive a supply voltage;
a current output node coupleable to a current path through the power transistor;
a control output node coupleable to a control terminal of the power transistor;
a sense resistor coupled between the input node and the current output node and configured to provide a sense voltage indicative of a current in said current path;

a voltage reference generator configured to provide a reference voltage; and a differential amplifier coupled to the sense resistor and the voltage reference generator, the differential amplifier including a first output configured to drive said control output node as a function of a difference between the sense voltage and the reference voltage; and a short-circuit protection circuit coupled between the differential amplifier and the control output node and configured to provide a short-circuit protection of the first output of the differential amplifier, wherein said short-circuit protection circuit comprises:

a short-circuit drive stage coupled to said first output of the differential amplifier; and a short-circuit switch coupled between the first output of the differential amplifier and the control output node, the short-circuit switch configured to be activated by the short-circuit drive stage as a function of the first output from the differential amplifier.

2. The current limiter circuit of claim 1, wherein the differential amplifier includes a high-voltage operational amplifier.

3. The current limiter circuit of claim 1, further comprising a voltage clamp circuit coupled to the input node and configured to provide a floating ground for the current limiter circuit, wherein said voltage clamp circuit comprises:

at least one zener diode having a first terminal coupled to the input node; and at least one resistor coupled between a second terminal of said at least one zener diode and a ground node;

wherein a connection between the least one zener diode and the at least one resistor is configured to provide said floating ground.

4. The current limiter circuit of claim 3, wherein the at least one resistor comprises a resistive network including a plurality of resistive cells arranged in series between said at least one zener diode and the ground node, wherein at least one resistive cell includes a parallel connection of a plurality of resistors.

5. The current limiter circuit of claim 1, further comprising a reaction-time circuit coupled between the differential amplifier and the current output node and configured to limit a short circuit current at said current output node, wherein the reaction time circuit comprises:

a reaction-time drive stage coupled to a second output of the differential amplifier; and a reaction-time switch coupled between the first output of the differential amplifier and the current output node, the reaction-time switch configured to be activated by the reaction-time drive stage as a function of the second output of the differential amplifier.

6. The current limiter circuit of claim 5, further including a low pass filter network coupled between said first output and said second output of the differential amplifier.

7. The current limiter circuit of claim 1, further comprising a voltage clamp circuit coupled to the input node and configured to provide a floating ground for the current limiter circuit, wherein the short-circuit drive stage is further coupled to said floating ground.

8. A power supply circuit, comprising:

a power transistor configured to control current flow in a current path feeding a load current to an electrical load;

a current limiter circuit, comprising:

a sense resistor coupled between an input node configured to receive a supply voltage and a source terminal of the power transistor, said sense resistor configured to provide a sense voltage indicative of the load current;

a voltage reference generator configured to provide a reference voltage; and a differential amplifier coupled to the sense resistor and the voltage reference generator, the differential amplifier including a first output configured to drive a control terminal of said power transistor as a function of a difference between the sense voltage and the reference voltage; and a short-circuit protection circuit coupled between the differential amplifier and the control terminal of said power transistor and configured to provide a short-circuit protection of the first output of the differential amplifier, wherein said short-circuit protection circuit comprises:

a short-circuit drive stage coupled to said first output of the differential amplifier; and a short-circuit switch coupled between the first output of the differential amplifier and the control output node, the short-circuit switch configured to be activated by the short-circuit drive stage as a function of the first output from the differential amplifier.

9. The current limiter circuit of claim 8, wherein the differential amplifier includes a high-voltage operational amplifier.

10. The current limiter circuit of claim 8, further comprising a voltage clamp circuit coupled to the input node and configured to provide a floating ground for the current limiter circuit, wherein said voltage clamp circuit comprises:

at least one zener diode having a first terminal coupled to the input node;

at least one resistor coupled between a second terminal of said at least one zener diode and a ground node;

wherein a connection between the least one zener diode and the at least one resistor is configured to provide said floating ground.

11. The current limiter circuit of claim 10, wherein the at least one resistor comprises a resistive network including a plurality of resistive cells arranged in series between said at least one zener diode and the ground node, wherein at least one resistive cell includes a parallel connection of a plurality of resistors.

12. The current limiter circuit of claim 8, further comprising a reaction-time circuit coupled between the differential amplifier and the source terminal and configured to limit a short circuit current at said source terminal, wherein the reaction time circuit comprises:

a reaction-time drive stage coupled to a second output of the differential amplifier;

a reaction-time switch coupled between the first output of the differential amplifier and the source terminal, the reaction-time switch configured to be activated by the reaction-time drive stage as a function of the second output of the differential amplifier.

13. The current limiter circuit of claim 12, further including a low pass filter network coupled between said first output and said second output of the differential amplifier.

14. The current limiter circuit of claim 8, further comprising a voltage clamp circuit coupled to the input node and configured to provide a floating ground for the current limiter circuit, wherein the short-circuit drive stage is further coupled to said floating ground.

15. A current limiter circuit for a power transistor feeding a load, comprising:
- an input node configured to receive a supply voltage;
- a current output node coupleable to a current path through the power transistor;
- a control output node coupleable to a control terminal of the power transistor;
- a sense resistor coupled between the input node and the current output node and configured to provide a sense voltage indicative of a current in said current path;
- a voltage reference generator configured to provide a reference voltage;
- a differential amplifier coupled to the sense resistor and the voltage reference generator, the differential amplifier including an output configured to generate a drive signal as a function of a difference between the sense voltage and the reference voltage;
- a voltage clamp circuit coupled to the input node and configured to provide a floating ground; and
- a short-circuit protection circuit coupled between the output of differential amplifier and the control output node and configured to control application of the drive signal to the control output node in response to the drive signal and the floating ground.

16. The current limiter circuit of claim 15, wherein said voltage clamp circuit includes:
- at least one zener diode having a first terminal coupled to the input node; and
- at least one resistor coupled between a second terminal of said at least one zener diode and a ground node;
- wherein a connection between the least one zener diode and the at least one resistor is configured to provide said floating ground.

17. The current limiter circuit of claim 16, wherein the at least one resistor comprises a resistive network including a plurality of resistive cells arranged in series between said at least one zener diode and the ground node, wherein at least one resistive cell includes a parallel connection of a plurality of resistors.

18. The current limiter circuit of claim 16, wherein said short-circuit protection circuit comprises:
- a short-circuit drive stage having a first input coupled to said output of the differential amplifier and a second input coupled to said floating ground; and
- a short-circuit switch coupled between the output of the differential amplifier and the control output node, the short-circuit switch configured to be activated by the short-circuit drive stage as a function of the control signal and the floating ground.

19. A current limiter circuit for a power transistor feeding a load, comprising:
- an input node configured to receive a supply voltage;
- a current output node coupleable to a current path through the power transistor;
- a control output node coupleable to a control terminal of the power transistor;
- a sense resistor coupled between the input node and the current output node and configured to provide a sense voltage indicative of a current in said current path;
- a voltage reference generator configured to provide a reference voltage;
- a differential amplifier coupled to the sense resistor and the voltage reference generator, the differential amplifier including a first output configured to drive said control output node as a function of a difference between the sense voltage and the reference voltage;
- a short-circuit protection circuit coupled between the differential amplifier and the control output node and configured to provide a short-circuit protection of the first output of the differential amplifier; and
- a reaction-time circuit coupled between a second output of the differential amplifier and the current output node and configured to limit a short circuit current at said current output node.

20. The current limiter circuit of claim 19, wherein said reaction-time circuit comprises:
- a reaction-time drive stage coupled to the second output of the differential amplifier; and
- a reaction-time switch coupled between the first output of the differential amplifier and the current output node, the reaction-time switch configured to be activated by the reaction-time drive stage as a function of the second output of the differential amplifier.

21. The current limiter circuit of claim 20, further including a low pass filter network coupled between said first output and said second output of the differential amplifier.

22. The current limiter circuit of claim 20, wherein said short-circuit protection circuit comprises:
- a short-circuit drive stage coupled to said first output of the differential amplifier; and
- a short-circuit switch coupled between the first output of the differential amplifier and the control output node, the short-circuit switch configured to be activated by the short-circuit drive stage as a function of the first output from the differential amplifier.

23. The current limiter circuit of claim 20, further comprising a voltage clamp circuit coupled to the input node and configured to provide a floating ground for the current limiter circuit.

24. The current limiter circuit of claim 23, wherein the short-circuit protection circuit is further coupled to said floating ground.

* * * * *